US006894539B2

(12) United States Patent
Kim

(10) Patent No.: US 6,894,539 B2
(45) Date of Patent: May 17, 2005

(54) DELAY LOCKED LOOP HAVING PHASE COMPARATOR

(75) Inventor: Kyung Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/737,756

(22) Filed: Dec. 18, 2003

(65) Prior Publication Data

US 2004/0183577 A1 Sep. 23, 2004

(30) Foreign Application Priority Data

Mar. 19, 2003 (KR) .................................. 10-2003-0017101

(51) Int. Cl.[7] .............................................. H03D 13/00
(52) U.S. Cl. ........................................ 327/3; 327/156
(58) Field of Search ............................. 327/1–12, 141, 327/147, 149, 156, 158

(56) References Cited

U.S. PATENT DOCUMENTS 5,935,257 A * 8/1999 Nishimura .................. 713/503
5,936,912 A * 8/1999 Kawabata et al. .......... 365/233
6,037,813 A * 3/2000 Eto et al. .................... 327/156
6,593,786 B2 * 7/2003 Jung .......................... 327/158
6,768,690 B2 * 7/2004 Kwon et al. ................ 365/194
6,822,494 B2 * 11/2004 Kim ........................... 327/160

* cited by examiner

*Primary Examiner*—Timothy P. Callahan
*Assistant Examiner*—Cassandra Cox
(74) *Attorney, Agent, or Firm*—Heller Ehrman White and McAuliffe LLP

(57) ABSTRACT

A delay locked loop features a phase comparator. The phase comparator compares a phase of a reference clock signal obtained by dividing a buffered external clock signal with a phase of a feedback clock signal considering delay time of delay lines and inside circuits, and controls a shift register for controlling the delay lines in response not only a rising clock signal outputted from a clock buffer but also a falling clock signal depending on the comparison result, thereby rapidly locking an initial phase and tracking the phase in spite of fast delay variations by external noises.

15 Claims, 7 Drawing Sheets

DELAY LOCKED LOOP HAVING PHASE COMPARATOR

BACKGROUND OF THE INVENTION

1. Field of the Invention

The present invention relates to a delay locked loop (hereinafter, referred to as "DLL") having a phase comparator, and more particularly to a DLL having a phase comparator including a shift register controller for controlling a shift register of a delay line, for performing fast phase locking and phase tracking.

2. Description of the Background Art

In general, a DLL is a circuit for controlling external output timing of data of a dynamic random access memory (hereinafter, referred to as "DRAM") in response to an external clock signal inputted from the outside of the DRAM. In order to transmit the data to a chipset without an error, the DRAM and the chipset must be synchronized with the clock signal.

That is, when the external clock signal is inputted to the DRAM, a phase of the external clock signal is delayed by logic circuits such as a clock input buffer, a line loading and a data output buffer, and thus becomes different from a phase of an internal clock signal. The DLL is used to compensate for the phase difference.

The DLL compensates for the phase Clock Skew delayed by circuits inside of the DRAM, namely equalizes output timing of the data sensed in a DRAM core from the data output buffer to timing of the externally-inputted clock signal, so that the phase of the data outputted from the inside to the outside cannot be different from the phase of the clock signal.

FIG. 1 is a block diagram illustrating a general register controlled DLL.

The register controlled DLL includes first and second clock buffers 2 and 4, first and second delay lines 6 and 8, a dummy clock buffer 10, a divider 12, a phase comparator 14, a delay controller 16, a dummy delay line 18 and a replica circuit 20.

The first and second clock buffers 2 and 4 respectively output a rising internal clock signal RCLK synchronized with a rising edge of an external clock signal CLK and a falling internal clock signal FCLK synchronized with a falling edge of the external clock signal CLK, in response to the external clock signal CLK and a clock signal CLKB having the opposite phase to the external clock signal CLK.

The first and second delay lines 6 and 8 respectively delay phases of the internal clock signals RCLK and FCLK from the first and second clock buffers 2 and 4. Here, the delay lines 6, 8 and 18 are formed by connecting a plurality of unit delay cells having NAND gates in series. Signals for controlling each unit delay cell correspond to signals outputted from a shift register one by one. The clock signal is transmitted to the unit delay cell for which a value of an output terminal of the shift register is a high level, to form a delay path.

The dummy clock buffer 10 buffers the external clock signal CLK and outputs the internal clock signal.

The divider 12 divides a frequency of the internal clock signal from the dummy clock buffer 10 by a specific divider ratio (1/N) for low power consumption. Here, N is a positive number and generally 8 or 4.

The phase comparator 14 compares the phase of the input clock signal with the phase of the output clock signal, and detects phase difference between the two clock signals. Here, the phase comparator 14 compares a phase of a reference clock signal REC divided by the divider 12 with a phase of a clock signal FBC fed back through the inside circuits of the DLL.

The delay controller 16 includes a logic circuit for deciding an input path of the delay lines 6, 8 and 18 and a bi-directional shift register. The delay controller 16 controls delay rates of the first and second delay lines 6 and 8 and the dummy delay line 18 in response to the output signal from the phase comparator 14.

The dummy delay line 18 has the same structure as the first and second delay lines 6 and 8, and delays the phase of the divided reference clock signal REC.

The replica circuit 20 includes modeling circuits of delay elements until the clock signal inputted from the outside of the chip is outputted to the delay line and the clock signal outputted from the delay line is outputted to the outside of the chip.

In order to synchronize the phases of the external clock signal and the internal clock signal, the phase comparator 14 compares the two clock signals in the real time.

The phase comparator 14 provides phase information of the two clock signals to the delay controller 16 (shift register array) to control the delay rates of the delay lines 6, 8 and 18, and thus decreases the phase difference.

The phase comparator 14 divides the state of the external clock signal and the internal clock signal into lead, lag, lock, lead more than long delay and lag more than long delay. Here, the long delay of the lead more than long delay or lag more than long delay state is identical to the delay time of the unit delay cells of the delay lines 6, 8 and 18 corresponding to the divider ratio of the divider 12. The divider ratio of the divider 12 is 8, and thus the long delay is the delay time by 8 unit delay cells.

The delay controller 16 outputs signals for controlling the delay lines 6, 8 and 18 depending on the five states. In the lead state, the delay controller 16 generates a shift left signal, and in the lag state, the delay controller 16 generates one shift right signal, in one period of the two clock signals.

In the lock state, the delay controller 16 does not generate shift signals, and in the lead more than long delay or lag more than long delay state, the delay controller 16 controls the shift operation in response to the non-divided clock signal in one comparison period of the two divided clock signals.

FIG. 2 is a detailed circuit diagram illustrating the conventional phase comparator.

The phase comparator includes a comparing unit 22 for comparing the phase of the reference clock signal REC obtained by dividing a dummy clock signal outputted from the dummy clock buffer 10 by the divider 12 with the phase of the feedback clock signal FBC, and a shift register control unit 24 for controlling the delay controller 16 having the shift register for controlling the delay time of the delay lines 6, 8 and 18 in response to the data from the comparing unit 22.

The comparing unit 22 is comprised of first and second unit comparing units 26a and 26b for detecting the normal lead state and the normal lag state, third and fourth unit comparing units 26c and 26d for detecting the lead more than long delay state and the lag more than long delay state, a first logic unit 28 for logically combining the reference clock signal REC and the feedback clock signal FBC, a second logic unit 30 for logically combining the output signals PC1~PC4 from the first and second unit comparing units 26a and 26b, a third logic unit 32 for logically combining the output signals A17 and A2 from the third and fourth unit comparing units 26c and 26d, and a fourth logic unit 34 for logically combining the output signal from the third logic unit 32, the signal obtained by inverting the phase of the signal outputted from the first logic unit 28 by an inverter, and the driver clock signal RCLKDLL outputted from the first delay line 6 through a driver. Here, the third unit comparing unit 26c includes a second delay unit 36b having the same delay time for delaying the phase of the feedback clock signal FBC as the delay time by the unit delay cells of the delay lines 6, 8 and 18 corresponding to the divider ratio of the divider 12, the fourth unit comparing unit 26d includes a third delay unit 36c having the same delay time for delaying the phase of the reference clock signal REC as the delay time by the unit delay cells of the delay lines 6, 8 and 18 corresponding to the divider ratio of the divider 12, and the second unit comparing unit 26b includes a first delay unit 36a having the shorter delay time for delaying the phase of the feedback clock signal FBC than the other delay units 36b and 36c.

The shift register control unit 24 includes a T flip-flop 38 synchronized with the accelerating control signal AC from the fourth logic unit 34, and a fifth logic unit 40 for logically combining signals L1 and L2 outputted from the second logic unit 30, and the output signals M1 and M2 from the T flip-flop 38, and outputting shift right signals SR1 and SR2 and shift left signals SL1 and SL2.

The comparing unit 22 compares the phases of the reference clock signal REC and the feedback clock signal FBC, and divides the comparison result into five states. Here, the five states are normal lead, normal lag, lock, lead more than long delay and lag more than long delay.

Accordingly, the shift register control unit 24 sets and outputs different state combinations of the shift right signals SR1 and SR2 and the shift left signals SL1 and SL2 depending on the five states which are output results from the comparing unit 22. In the lock state, the shift register control unit 24 does not generate the shift signals.

FIGS. 3a to 3d are timing diagrams illustrating the operation of the conventional phase comparator of FIG. 2 depending on the four states except the lock state.

FIG. 3a is a timing diagram of the operation signals when the result of the phase comparator of FIG. 2 is the normal lead state.

The accelerating control signal AC has a low level, and thus one shift operation is performed in one period of the divided clock signals REC and FBC. That is, the first shift right signal SR1 maintains a high level in one period of the divided clock signals REC and FBC, and the second shift right signal SR2 maintains a high level in one period of the divided clock signals REC and FBC. Here, the shift left signals SL1 and SL2 maintain a low level.

FIG. 3b is a timing diagram of the operation signals when the result of the phase comparator of FIG. 2 is the normal lag state.

The accelerating control signal AC has a low level, and thus one shift operation is performed in one period of the divided clock signals REC and FBC. That is, the first shift left signal SL1 maintains a high level in one period of the divided clock signals REC and FBC, and the second shift left signal SL2 maintains a high level in one period of the divided clock signals REC and FBC. Here, the shift right signals SR1 and SR2 maintain a low level.

FIG. 3c is a timing diagram of the operation signals when the result of the phase comparator of FIG. 2 is the lead more than long delay state.

The accelerating control signal AC has a high level, and thus the shift operation is performed in response to the non-divided rising clock signal RCLK in one period of the divided clock signals REC and FBC. That is, the first shift right signal SR1 and the second shift right signal SR2 alternately have a high level at every rising edge of the external clock signal ECLK. Here, the shift left signals SL1 and SL2 maintain a low level.

FIG. 3d is a timing diagram of the operation signals when the result of the phase comparator of FIG. 2 is the lag more than long delay state.

The accelerating control signal AC has a high level, and thus the shift operation is performed in response to the non-divided rising clock signal RCLK in one period of the divided clock signals REC and FBC. That is, the first shift left signal SL1 and the second shift left signal SL2 alternately have a high level at every rising edge of the external clock signal ECLK. Here, the shift right signals SR1 and SR2 maintain a low level.

In the conventional DLL, the clock signal used for fast phase locking is the clock signal generated depending on the rising edge. The shift operation is performed for the one period of the clock signal in response to the non-divided clock signal. However, the clock signal generated depending on the falling edge is not used for the shift operation, which increases the phase lock time. It is also impossible to compensate for tracking due to phase variations by noises.

SUMMARY OF THE INVENTION

Accordingly, it is a primary object of the present invention to reduce phase lock time by performing two shift operations in one period of an external clock signal.

Another object of the present invention is to compensate for tracking in phase variations by noises of an external clock signal.

In an embodiment, a delay locked loop comprises a clock buffer, delay lines, a divider, a phase comparator, a shift register and a replica circuit. The phase comparator comprises a phase comparing block and a shift register control block. The phase comparing block compares a phase of a reference clock signal obtained by dividing a buffered external clock signal with a phase of a feedback clock signal obtained by delaying the reference clock signal with the delay lines. The shift register control block controls the shift register for controlling the delay time of the delay lines, in response to the output signal from the phase comparing block, a rising clock signal synchronized with a rising edge of the external clock signal, and a falling clock signal synchronized with a falling edge thereof.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A DLL having a phase comparator in accordance with a preferred embodiment of the present invention will be described in detail with reference to the accompanying drawings.

The DLL having the phase comparator compares phases of divided reference clock signal and feedback clock signal, and controls a shift register for controlling delay lines in response to not only a rising clock signal outputted from a buffer but also a falling clock signal depending on the comparison result, thereby rapidly locking an initial phase and tracking the phase in spite of fast delay variations by external noises.

Figure 1:
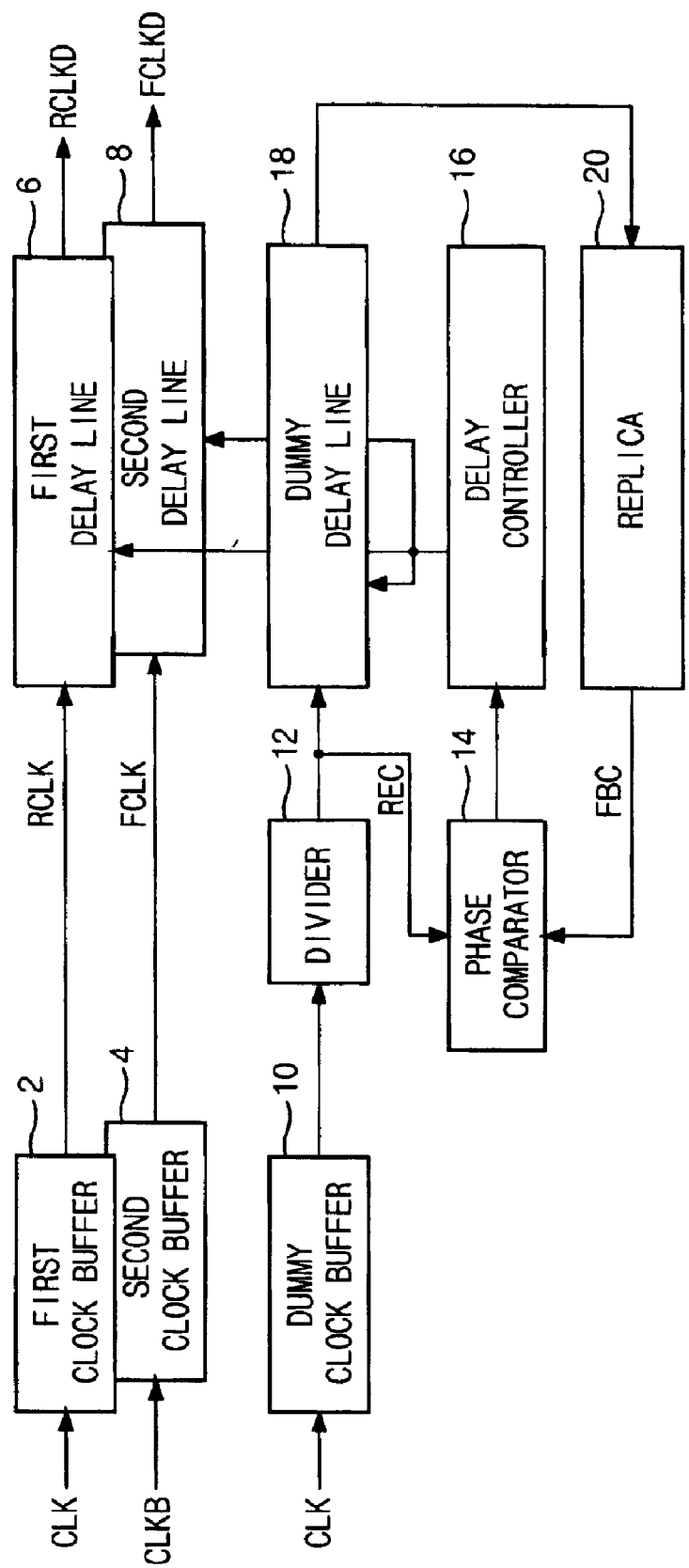
FIG. 1 is a block diagram illustrating a general register controlled DLL.
Figure 2:
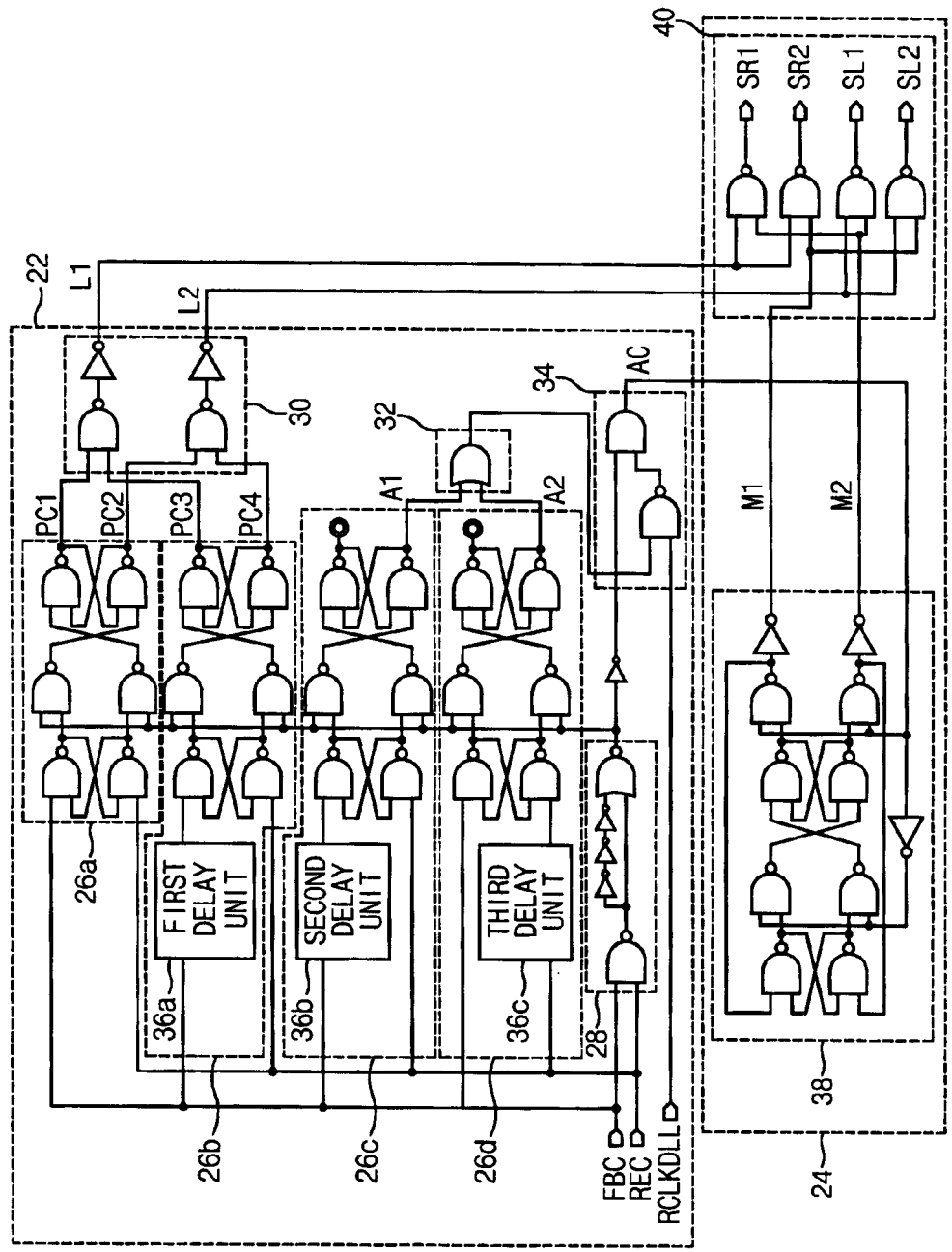
FIG. 2 is a detailed circuit diagram illustrating a conventional phase comparator of FIG. 1.
Figure 3A:
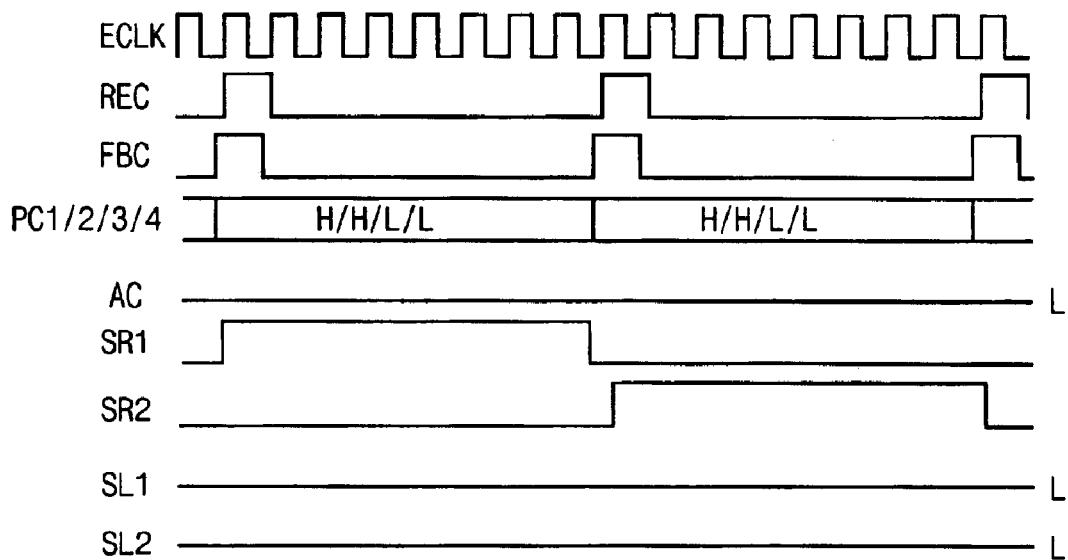
FIGS. 3a to 3d are timing diagrams illustrating operation of the conventional phase comparator of FIG. 2 depending on four states except a lock state.
Figure 3B:
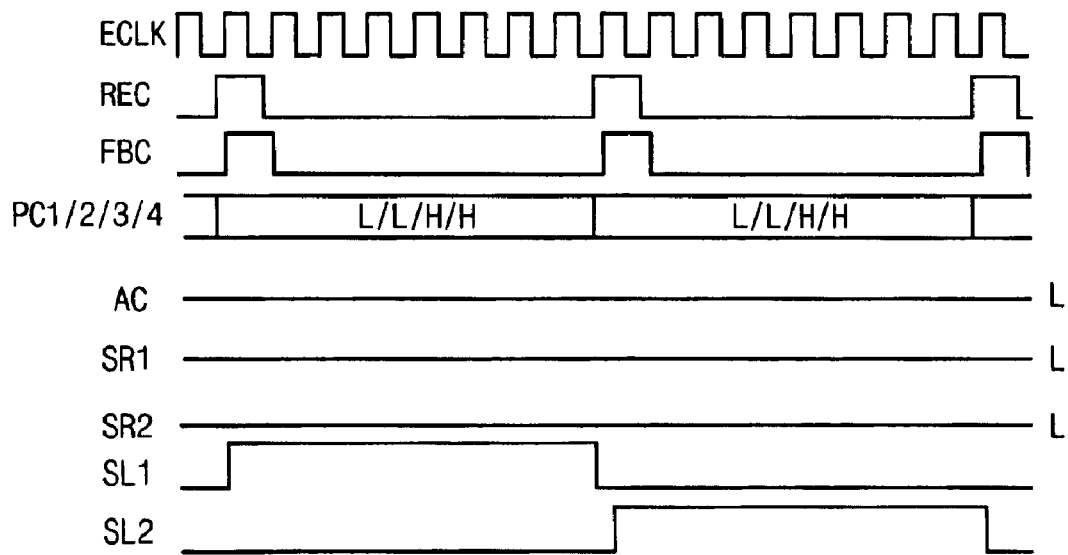
Figure 3C:
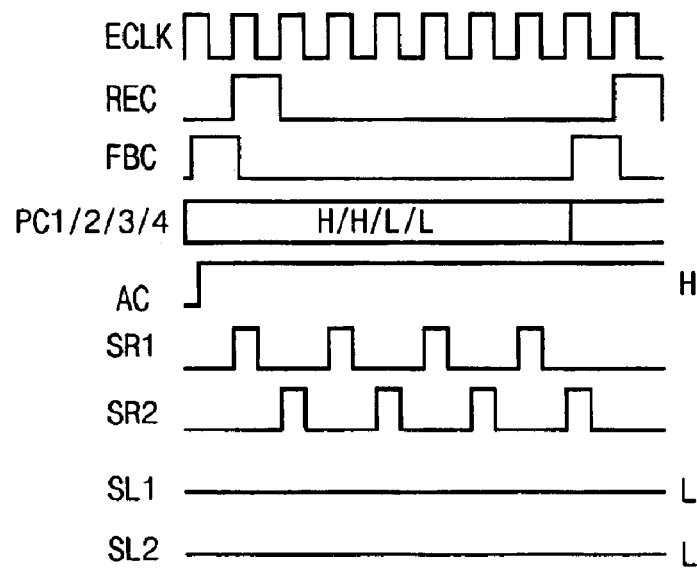
Figure 3D:
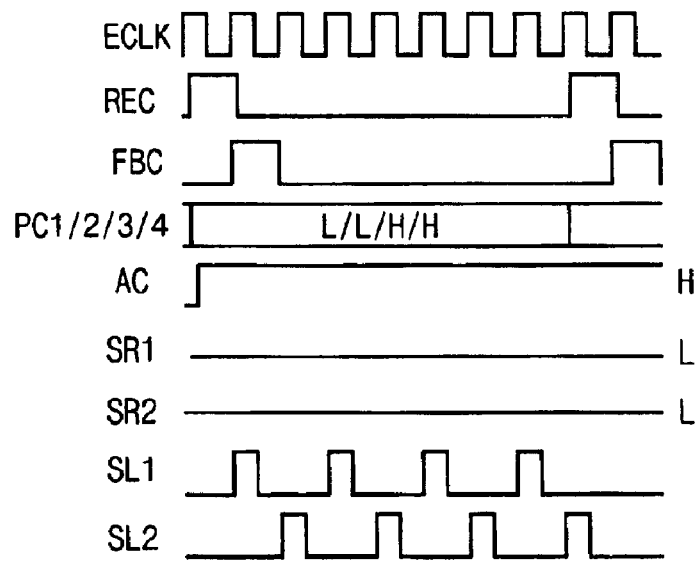
Figure 4:
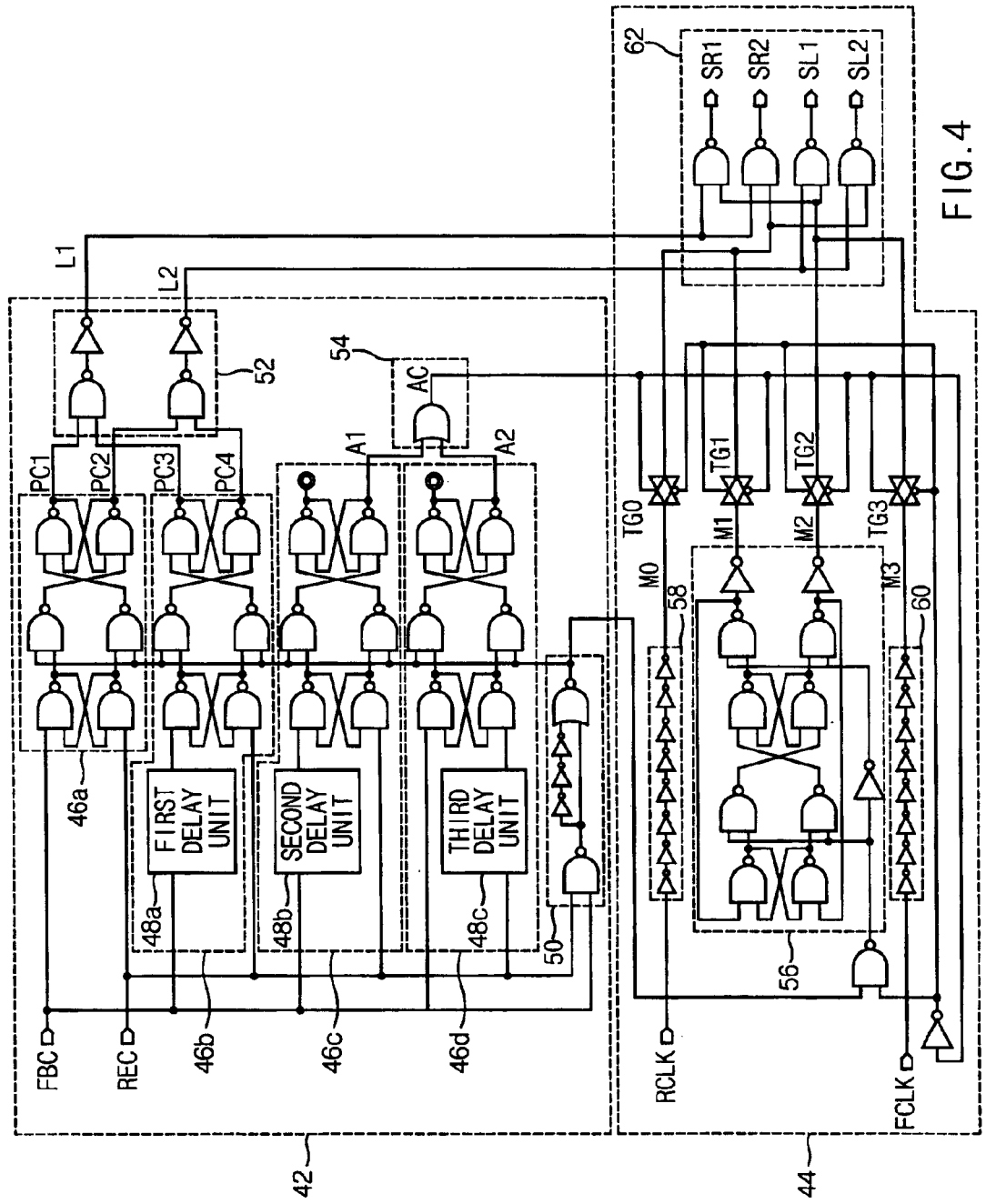
FIG. 4 is a detailed circuit diagram illustrating a phase comparator according to an embodiment of the present invention.

FIG. 4 is a detailed circuit diagram illustrating the phase comparator according to an embodiment of the present invention.

The phase comparator includes a comparing unit 42 for comparing a phase of a reference clock signal REC obtained by dividing a dummy clock signal outputted from a dummy clock buffer 10 by a divider 12 with a phase of a feedback clock signal FBC obtained by passing the dummy clock signal outputted from the dummy clock buffer 10 through a dummy delay line 18 and a replica circuit 20, and a shift register control unit 44 for controlling a delay controller 16 having a shift register for controlling the delay time of delay lines 6, 8 and 18 in response to the signals outputted from the comparing unit 42.

The comparing unit 42 compares the phases of the reference clock signal REC and the feedback clock signal FBC, and divides the comparison result into five states. Here, the five states are normal lead, normal lag, lock, lead more than long delay and lag more than long delay.

The comparing unit 42 includes unit comparing units 46a~46d for detecting each state, and logic units 50, 52 and 54. The second, third and fourth unit comparing units 46b, 46c and 46d have first, second and third delay units 48a, 48b and 48c, respectively.

Here, the delay time of the first delay unit 48a is shorter than the delay time of the other delay units 48b and 48c.

The delay time of the third delay unit 48c of the fourth unit comparing unit 46d for detecting the lag more than long delay state is identical to the delay time by unit delay cells of the delay lines 6, 8 and 18 corresponding to a divider ratio of a divider 12, and the delay time of the second delay unit 48b of the third unit comparing unit 46c for detecting the lead more than long delay state is twice as long as the delay time of the third delay unit 48c.

Therefore, the shift register control unit 44 sets and outputs different state combinations of the shift right signals SR1 and SR2 and the shift left signals SL1 and SL2 depending on the five states which are output results from the comparing unit 42.

In addition, the comparing unit 42 includes a first logic unit 50 for logically combining the reference clock signal REC and the feedback clock signal FBC, a second logic unit 52 for logically combining the output signals PC1~PC4 from the first and second unit comparing units 46a and 46b, and a third logic unit 54 for logically combining the output signals A1 and A2 from the third and fourth unit comparing units 46c and 46d.

The shift register control unit 44 includes a T flip-flop 56 controlled by the output signal from the first logic unit 50 and the output signal AC from the third logic unit 54, fourth and fifth delay units 58 and 60 for respectively delaying a rising clock signal RCLK and a falling clock signal FCLK, transmission gates TG0~TG3 for selectively transmitting the output signals M1 and M2 from the T flip-flop 56, and the output signals M0 and M3 from the fourth and fifth delay units 58 and 60 in response to the output signal AC from the third logic unit 54, and a fourth logic unit 62 for generating the shift signals SR1, SR2, SL1 and SL2 by combining the signals selectively transmitted from the transmission gates TG0~TG3 and the output signals L1 and L2 from the second logic unit 52. Here, the shift register control unit 44 does not generate the shift signals in the lock state.

FIGS. 5a to 5d are timing diagrams illustrating the operation of the phase comparator depending on the four states except the lock state according to an embodiment of the present invention.

Figure 5A:
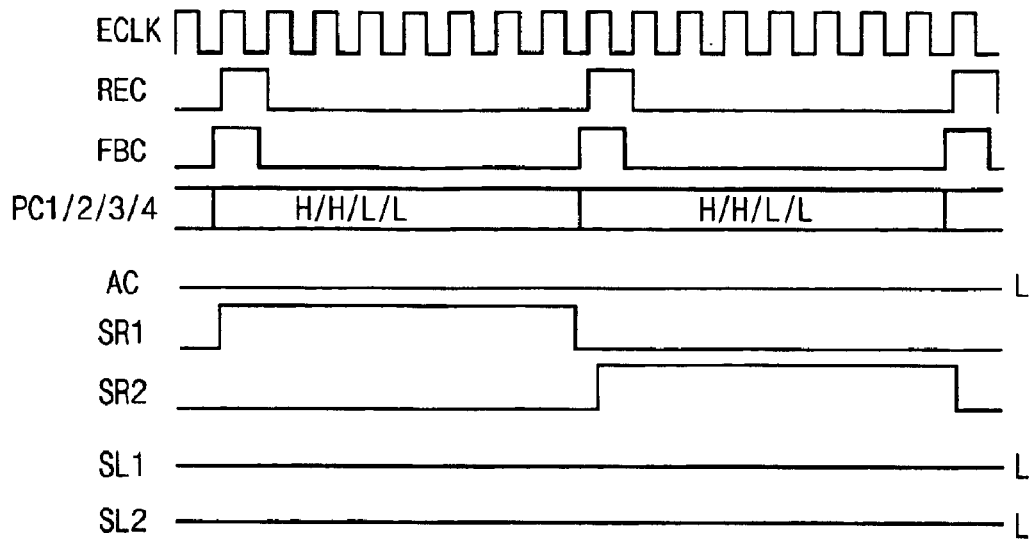
FIGS. 5a to 5d are timing diagrams illustrating the operation of the phase comparator of FIG. 4 depending on four states except a lock state.

FIG. 5a is a timing diagram of the operation signals when the result of the phase comparator of FIG. 4 is the normal lead state.

The accelerating control signal AC has a low level, and thus one shift operation is performed in one period of the divided clock signals REC and FBC. That is, the first shift right signal SR1 maintains a high level in one period of the divided clock signals REC and FBC, and the second shift right signal SR2 maintains a high level in one period of the divided clock signals REC and FBC. Here, the shift left signals SL1 and SL2 maintain a low level.

Figure 5B:
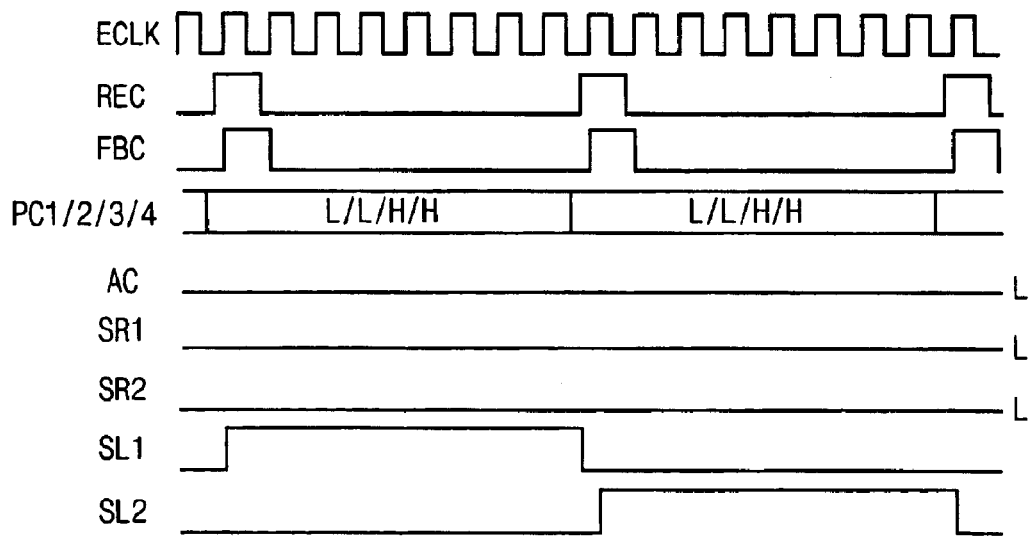

FIG. 5b is a timing diagram of the operation signals when the result of the phase comparator of FIG. 4 is the normal lag state.

The accelerating control signal AC has a low level, and thus one shift operation is performed in one period of the divided clock signals REC and FBC. That is, the first shift left signal SL1 maintains a high level in one period of the divided clock signals REC and FBC, and the second shift left signal SL2 maintains a high level in one period of the divided clock signals REC and FBC. Here, the shift right signals SR1 and SR2 maintain a low level.

Figure 5C:
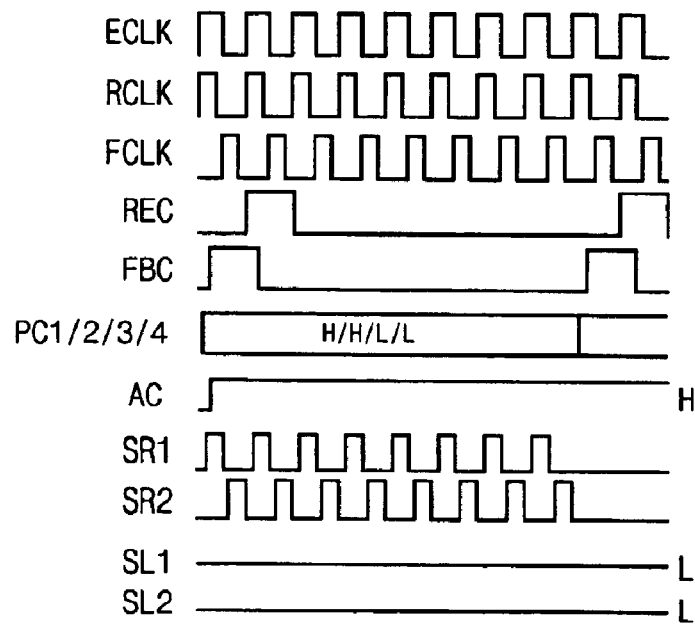

FIG. 5c is a timing diagram of the operation signals when the result of the phase comparator of FIG. 4 is the lead more than long delay state.

The accelerating control signal AC has a high level, and thus the shift operation is performed in response to the non-divided rising clock signal RCLK and falling clock signal FCLK in one period of the divided clock signals REC and FBC. That is, the first shift right signal SR1 and the second shift right signal SR2 alternately have a high level at every rising and falling edge of the external clock signal ECLK. Here, the shift left signals SL1 and SL2 maintain a low level.

Figure 5D:
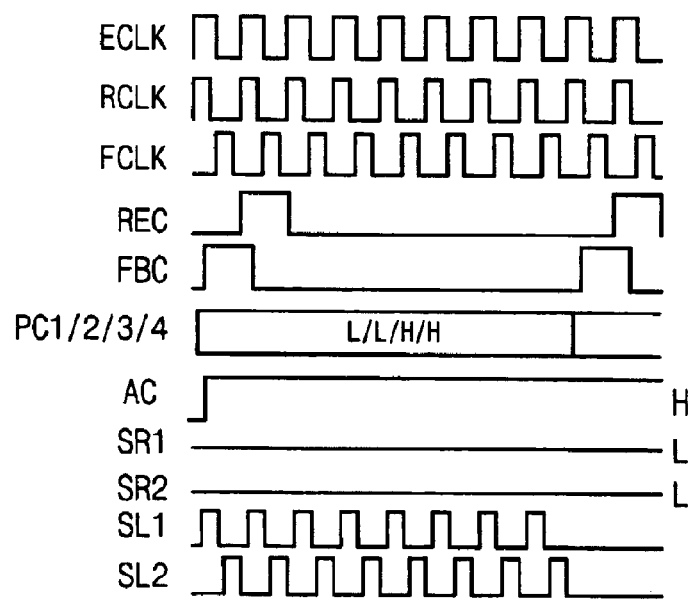

FIG. 5d is a timing diagram of the operation signals when the result of the phase comparator of FIG. 4 is the lag more than long delay state.

The accelerating control signal AC has a high level, and thus the shift operation is performed in response to the non-divided rising clock signal RCLK and falling clock signal FCLK in one period of the divided clock signals REC and FBC. That is, the first shift left signal SL1 and the second shift left signal SL2 alternately have a high level at every rising and falling edge of the external clock signal ECLK. Here, the shift right signals SR1 and SR2 maintain a low level.

When the phase difference between the reference clock signal REC and the feedback clock signal FBC is greater than the delay time by the unit delay cells of the delay lines 6, 8 and 18 corresponding to the divider ratio of the divider 12, the accelerating control signal AC has a high level, the first and fourth transmission gates TG0 and TG3 are turned on, and thus the shift signals SR1, SR2, SL1 and SL2 are generated in response to the signals M0 and M3 obtained by delaying the rising clock signal RCLK and the falling clock signal FCLK by the fourth and fifth delay units 58 and 60.

On the other hand, when the phase difference between the reference clock signal REC and the feedback clock signal FBC is smaller than the delay time by the unit delay cells of the delay lines 6, 8 and 18 corresponding to the divider ratio of the divider 12, the accelerating control signal AC has a low level, the second and third transmission gates TG1 and TG2 are turned on, and thus the shift signals SR1, SR2, SL1 and SL2 are generated in response to the inverted and non-inverted output signals M1 and M2 from the T flip-flop 56.

Here, a clock duty ratio of the rising clock signal RCLK and the falling clock signal FCLK implies that the high level state time (m) is shorter than the low level state time (n). Accordingly, the high level period of the rising clock signal RCLK and the falling clock signal FCLK is shorter than the low level period thereof, to prevent overlapping of the shift signals.

As discussed earlier, in accordance with the present invention, the DLL having the phase comparator controls the shift register for controlling the variable delay lines in response to not only the rising clock signal but also the falling clock signal, thereby rapidly locking the initial phase.

Furthermore, the DLL having the phase comparator can rapidly track the phase in spite of fast delay variations by external noises.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A delay locked loop comprising delay lines, a divider, a phase comparator, a delay controller and a replica circuit, wherein the phase comparator comprises:

a phase comparing block for comparing a phase of a reference clock signal obtained by dividing an external clock signal with a phase of a feedback clock signal obtained by delaying the reference clock signal with the delay lines; and a shift register control block for controlling the delay controller for controlling the delay time of the delay lines, in response to the output signal from the phase comparing block, a rising clock signal synchronized with a rising edge of the external clock signal, and a falling clock signal synchronized with a falling edge thereof.

2. The delay locked loop of claim 1, wherein a high level period of the rising clock signal and the falling clock signal is shorter than a low level period thereof.

3. The delay locked loop of claim 1, wherein the phase comparator generates shift signals in response to the reference clock signal and the feedback clock signal when the phase difference between the reference clock signal and the feedback clock signal is smaller than the delay time by unit delay cells of the delay lines corresponding to a divider ratio of the divider.

4. The delay locked loop of claim 1, wherein the phase comparator generates shift signals in response to the rising clock signal and the falling clock signal when the phase difference between the reference clock signal and the feedback clock signal is greater than the delay time by unit delay cells of the delay lines corresponding to a divider ratio of the divider.

5. The delay locked loop of claim 1, wherein the phase comparing block comprises:

a plurality of first comparing blocks for detecting the cases that the phase difference between the reference clock signal and the feedback clock signal is smaller than the delay time by unit delay cells of the delay lines corresponding to a divider ratio of the divider; and a plurality of second comparing blocks for detecting the cases that the phase difference between the reference clock signal and the feedback clock signal is greater than the delay time by the unit delay cells of the delay lines corresponding to the divider ratio of the divider.

6. The delay locked loop of claim 5, wherein the first comparing block comprises:

a first comparing means for detecting a lead state that the phase of the feedback clock signal leads the phase of the reference clock signal; and a second comparing means for detecting a lag state that the phase of the feedback clock signal lags behind the phase of the reference clock signal.

7. The delay locked loop of claim 6, wherein the second comparing means comprises a first delay means for delaying the feedback clock signal for a first delay time.

8. The delay locked loop of claim 5, wherein the second comparing block comprises:

a third comparing means for detecting a lead state that the phase of the feedback clock signal leads the phase of the reference clock signal; and a fourth comparing means for detecting a lag state that the phase of the feedback clock signal lags behind the phase of the reference clock signal.

9. The delay locked loop of claim 7, wherein the third comparing means comprises a second delay means for delaying the feedback clock signal for a second delay time.

10. The delay locked loop of claim 9, wherein the fourth comparing means comprises a third delay means for delaying the reference clock signal for a third delay time.

11. The delay locked loop of claim 10, wherein the second delay time is twice as long as the third delay time.

12. The delay locked loop of claim 5, wherein the phase comparing block further comprises:

a first logic means for logically combining the reference clock signal and the feedback clock signal;

a second logic means for logically combining the output signals from the plurality of first comparing blocks; and a third logic means for logically combining the output signals from the plurality of second comparing blocks.

13. The delay locked loop of claim 12, wherein the shift register control block comprises:

a fourth logic means for generating signals for controlling one shift operation to be performed in one period of the reference clock signal, in response to the output signals from the first logic means and the output signals from the third logic means;

a plurality of transmission means controlled by the output signals from the third logic means, for selectively transmitting the output signals from the fourth logic means, the rising clock signal and the falling clock signal; and a fifth logic means for generating the shift signals by logically combining the signals transmitted from the plurality of transmission means and the output signals from the second logic means.

14. The delay locked loop of claim 13, wherein the shift register control block further comprises a fifth delay means for delaying the rising clock signal for a predetermined time, and a sixth delay means for delaying the falling clock signal for a predetermined time.

15. The delay locked loop of claim 14, wherein the fifth delay means and the sixth delay means have the same delay time.

* * * * *